(12) United States Patent
Schulz

(10) Patent No.: US 8,970,302 B2
(45) Date of Patent: Mar. 3, 2015

(54) OPERATIONAL AMPLIFIER WITH SELECTIVE INPUT

(71) Applicant: Power Integrations, Inc., San Jose, CA (US)

(72) Inventor: Frank Joseph Schulz, Ottawa (CA)

(73) Assignee: Power Integrations, Inc., San Jose, CA (US)

( * ) Notice: Subject to any disclaimer, the term of this patent is extended or adjusted under 35 U.S.C. 154(b) by 29 days.

(21) Appl. No.: 13/958,865

(22) Filed: Aug. 5, 2013

(65) Prior Publication Data

US 2015/0035597 A1 Feb. 5, 2015

(51) Int. Cl.
*H03F 3/45* (2006.01)
(52) U.S. Cl.
CPC .................................. *H03F 3/45273* (2013.01)
USPC ........................................... 330/257; 330/261
(58) Field of Classification Search
USPC .................................. 330/257, 253, 261, 254
See application file for complete search history.

(56) References Cited

U.S. PATENT DOCUMENTS

| | | | | |
|---|---|---|---|---|
| 7,183,852 | B2 * | 2/2007 | Abe | 330/257 |
| 7,358,812 | B2 * | 4/2008 | Portmann et al. | 330/255 |
| 7,602,247 | B2 * | 10/2009 | Nakamura | 330/254 |

* cited by examiner

*Primary Examiner* — Henry Choe
(74) *Attorney, Agent, or Firm* — Blakely Sokoloff Taylor & Zafman LLP

(57) ABSTRACT

An operational amplifier includes a selective differential stage including a first current mirror and a current distribution circuit. First and second legs of the first current mirror are responsive to current in first and second paths of the current distribution circuit, which distributes a tail current in response to a first signal received by a first input of the operational amplifier. Current in a first path of a selection circuit in the second path of the current distribution circuit is responsive to a second signal received by a second input of the operational amplifier. Current in the second path of the selection circuit is responsive to a third signal received by a third input of the operational amplifier. An output stage generates an output signal responsive to a difference between the first signal and one of the second and third signals.

22 Claims, 7 Drawing Sheets

OPERATIONAL AMPLIFIER WITH SELECTIVE INPUT

BACKGROUND INFORMATION

1. Field of the Disclosure

The present invention relates generally to electronic amplifiers, and more specifically to electronic amplifiers that set a maximum value of an output signal.

2. Background

Electronic circuits often use operational amplifiers to process analog signals. An operational amplifier is a convenient building block for circuits that modify analog signals in a particular way, such for example changing amplitudes, filtering frequency components, or performing linear mathematical operations that may include summing with other signals, integrating, and differentiating.

Operational amplifiers typically can produce output voltages that approach the value of their power supply voltages. In many applications, it is desirable to limit the value of an output signal from an operational amplifier so that the output will remain within the acceptable range of input values for circuits that receive the output signal. It is generally good design practice to limit the magnitudes of signals to be within a range that guarantees controlled and reliable operation. Designers have devised clamping circuits that use diodes at the input or at the output of the operational amplifier to keep the output from exceeding a desired limit.

Known clamping circuits that use diodes can introduce undesirable characteristics and behavior that result from the switching of the diodes. A diode at the input can make the input impedance nonlinear and dependent on the magnitude of the signal. A diode on the output may block a large excursion of the output signal in one direction to the power supply voltage, only to allow a transient overshoot when the output recovers in the opposite direction.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
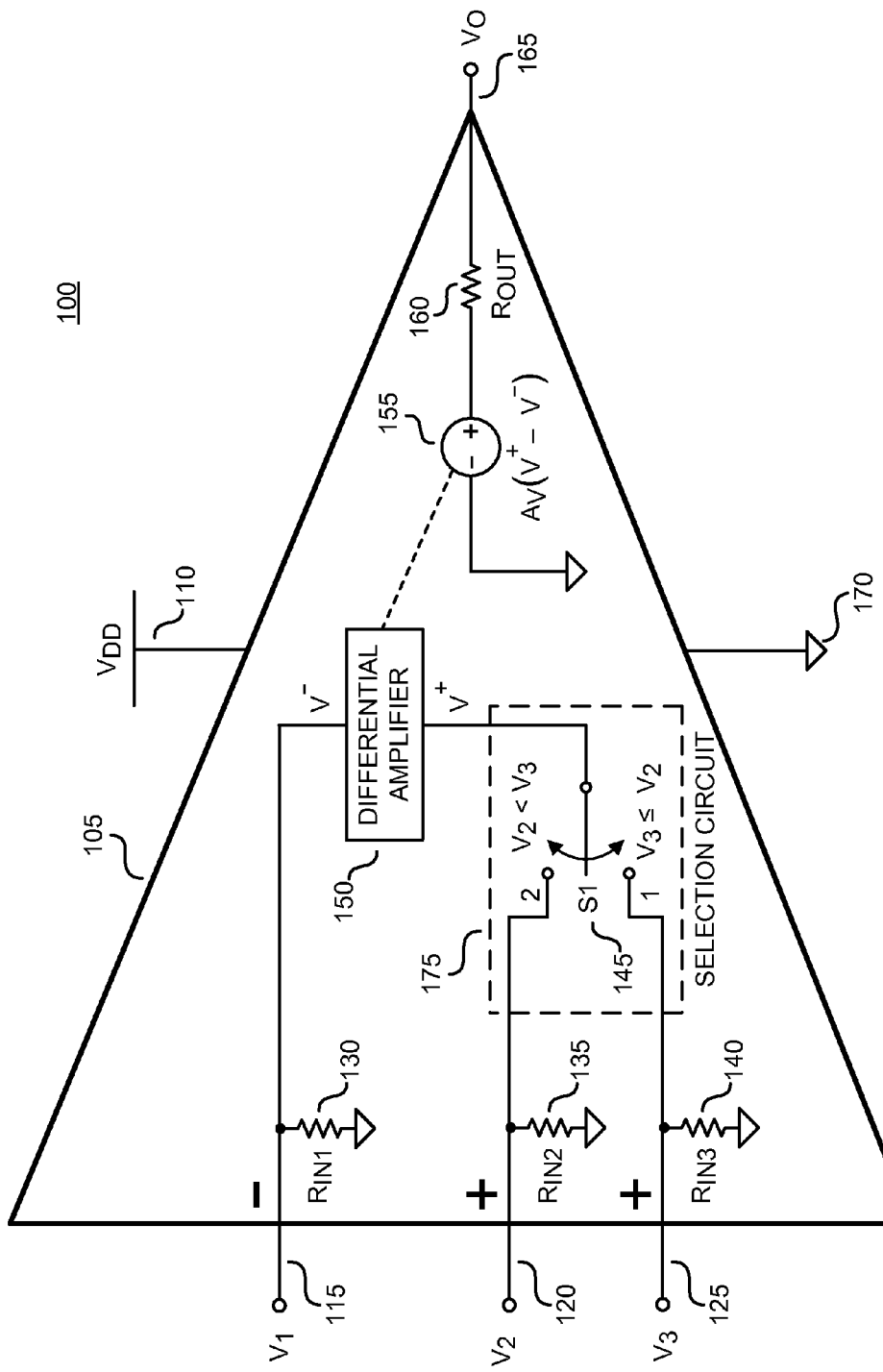
FIG. 1 is a symbolic schematic diagram that shows the salient features of an example operational voltage amplifier with a selective input in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

An operational amplifier that allows a designer to limit the excursion of the output while leaving the desirable properties of the conventional operational amplifier unaffected is disclosed herein in accordance with the teachings of the present invention. As will be discussed below, an example operational amplifier in accordance with the teachings of the present invention includes a selective differential stage and an output stage. The selective differential stage includes a first current mirror having first and second legs, and a current distribution circuit that has first and second paths. The first and second legs of the first current mirror are coupled to be responsive to current in the first and second paths of the current distribution circuit. The first and second paths of the current distribution circuit are coupled to distribute a tail current in response to a first signal coupled to be received by a first input of the operational amplifier. A selection circuit is included in the second path of the current distribution circuit. The selection circuit includes first and second paths. The current in the first path of the selection circuit is coupled to be responsive to a second signal coupled to be received by a second input of the operational amplifier. Current in the second path of the selection circuit is coupled to be responsive to a third signal coupled to be received by a third input of the operational amplifier. The output stage is coupled to generate an output signal responsive to the selective differential stage. The output signal is responsive to a difference between the first signal and one of the second and third signals.

To illustrate, the symbolic schematic diagram 100 of FIG. 1 shows the salient features of an example operational amplifier with a selective input 105 in accordance with the teachings of the present invention. The features are represented as equivalent circuits enclosed within the traditional outline of an isosceles triangle. Operational amplifiers are traditionally depicted with an output terminal at the apex of the triangle, and with inputs on terminals at the side of the triangle that is opposite the apex. An inverting input is conventionally designated by a negative sign (−), and a non-inverting input is conventionally designated by a positive sign (+).

All voltages in the example of FIG. 1 are defined with respect to a common return terminal 170, which is sometimes referred to as a ground terminal. A change in voltage at an inverting input moves the voltage at the output in the direction opposite to the change at the inverting input, whereas a change in voltage at a non-inverting input moves the voltage at the output in the same direction as the change at the non-inverting input. In other words, the output will go more negative when the voltage on an inverting input goes more positive, and the output will go more positive when the voltage on the non-inverting input goes more positive. Conversely, the voltage at the output will go more positive when the voltage on an inverting input goes more negative, and the voltage at the output will go more negative when the voltage on the non-inverting input goes more negative.

The example operational amplifier with selective input 105 receives a power supply voltage $V_{DD}$ between a power supply terminal 110 and the return terminal 170. The example operational amplifier with selective input 105 of FIG. 1 has a first input 115 (inverting) that receives a signal voltage $V_1$, a second input 120 (non-inverting) that receives a signal voltage $V_2$ and a third input 125 (also non-inverting) that receives a signal voltage $V_3$. A traditional operational amplifier would have one inverting input and only one non-inverting input.

The example operational amplifier with selective input 105 of FIG. 1 produces an output voltage $V_O$ at an output terminal 165 that is responsive to the input voltages $V_1$, $V_2$, and $V_3$ received at input terminals 115, 120, and 125 respectively.

The example operational amplifier with selective input 105 of FIG. 1 includes a differential amplifier 150 coupled between the inverting input 115 and the output of a selection circuit 175. Differential amplifier 150 receives a first voltage $V^-$ from inverting input 115. Differential amplifier 150 receives a second voltage $V^+$ from the output of selection circuit 175. Selection circuit 175 is represented by a single pole, double throw (SPDT) switch S1 145. In operation, selection circuit 175 couples either the second (non-inverting) input 120 or the third (non-inverting) input 125 as the voltage $V^+$ to an input of the differential amplifier 150. In the example of FIG. 1, the non-inverting input that receives the lesser voltage of the two non-inverting inputs is coupled to the differential amplifier 150 in accordance with the teachings of the present invention.

The example operational amplifier with selective input 105 of FIG. 1 also includes a controlled voltage source 155 that produces a voltage that is an amplified difference between the voltages coupled to the differential amplifier 150. More specifically, the voltage from controlled voltage source 155 in the example of FIG. 1 is the voltage $V^+$ selected by selection circuit 175 minus the voltage $V^-$ coupled to the inverting input 115, the difference multiplied by a gain $A_v$. The voltage difference $(V^+−V^-)$ may be referred to as the differential input voltage, and the voltage from controlled voltage source 115 may be described as the differential input voltage multiplied by the voltage gain $A_v$. In other words, the voltage source 155 produces a voltage given by the expression $A_v(V^+−V^-)$ where the gain $A_v$ is a relatively large number, typically greater than one hundred thousand. With a gain of one hundred thousand, a change of ten microvolts in the differential input voltage would produce a change of one volt in the output. As such, the operational amplifier with selective input 105 depicted in FIG. 1 is an operational voltage amplifier in accordance with the teachings of the present invention.

The example operational voltage amplifier with selective input 105 of FIG. 1 includes elements that model non-ideal characteristics inherent in practical circuits. The same non-ideal characteristics are present in traditional operational voltage amplifiers. One element that models a non-ideal characteristic is an output resistance $R_{OUT}$ 160 coupled between the controlled voltage source 155 and the output 165. It is desirable for the output resistance $R_{OUT}$ 160 to be as low as possible because the output resistance reduces the voltage that appears at the output 165 when the output delivers current to a load. The output resistance in practical operational voltage amplifiers is typically much less than 1000 ohms. Other elements that model non-ideal characteristics are the finite input resistances $R_{IN1}$ 130, $R_{IN2}$ 135, and $R_{IN3}$ 140. It is desirable for the input resistances to be as high as possible. Input resistances are typically greater than one million ohms for inputs that use bipolar transistors, and may be greater than one billion ohms for inputs that use field-effect transistors.

Figure 2:
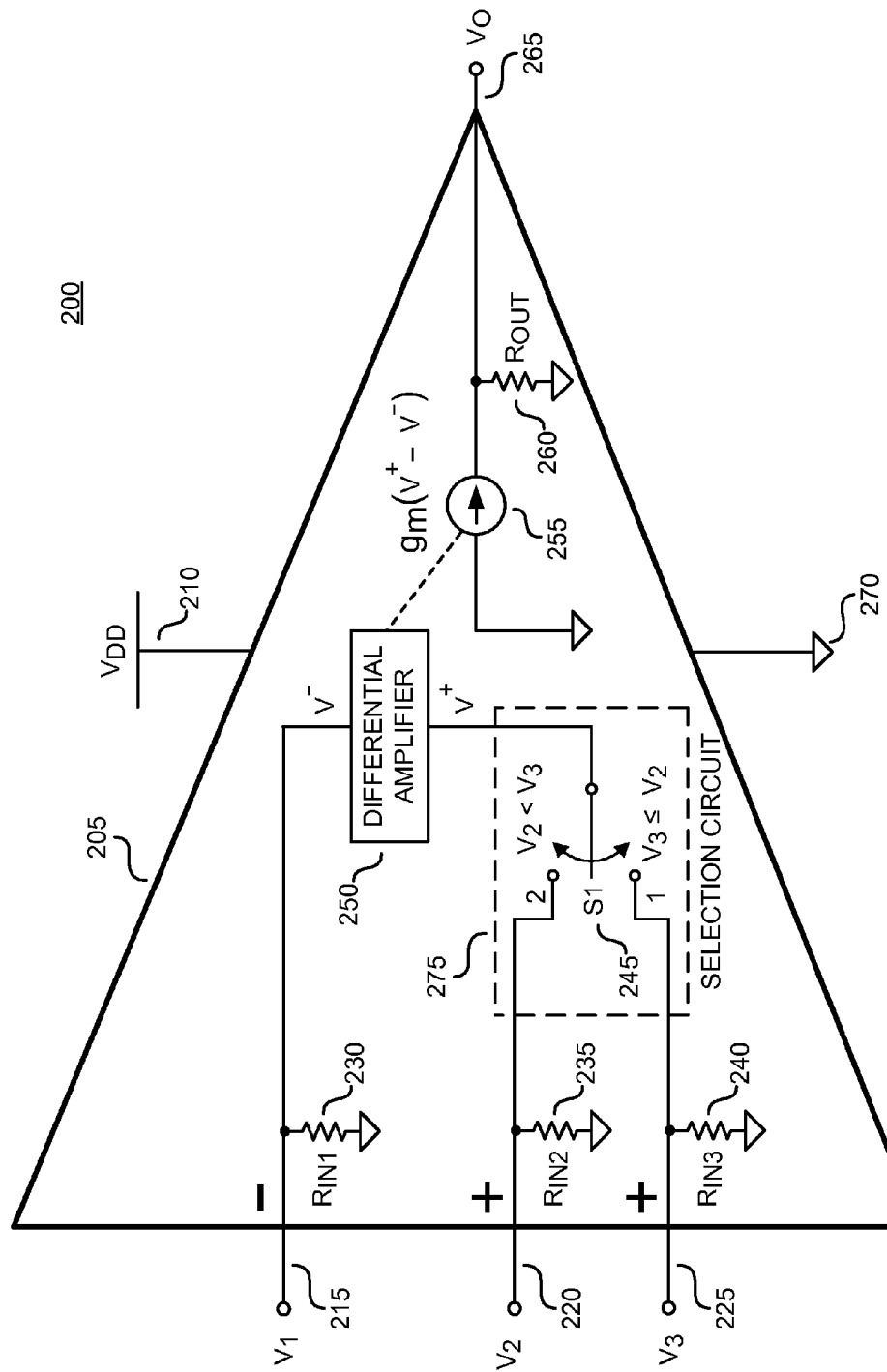
FIG. 2 is a symbolic schematic diagram that shows the salient features of an example operational transconductance amplifier with a selective input in accordance with the teachings of the present invention.

The symbolic schematic diagram 200 of FIG. 2 shows the salient features of another example operational amplifier with selective input 205 with many similarities to the example of FIG. 1. The example operational amplifier with selective input 205 receives a power supply voltage $V_{DD}$ between a power supply terminal 210 and a common terminal 270, signal voltages $V_1$, $V_2$, and $V_3$ at first, second, and third input terminals 215, 220, and 225 respectively, to produce an output voltage $V_O$ at an output terminal 265.

The example operational amplifier with selective input 205 of FIG. 2 includes a differential amplifier 250 coupled between the inverting input 215 and the output of a selection circuit 275. Differential amplifier 250 receives a first voltage $V^-$ from inverting input 215. Differential amplifier 250 receives a second voltage $V^+$ from the output of selection circuit 275. Selection circuit 275 is represented by a single pole, double throw (SPDT) switch S1 245. In operation, selection circuit 275 couples either the second (non-inverting) input 220 or the third (non-inverting) input 225 as the voltage $V^+$ to an input of the differential amplifier 250. In the example of FIG. 2, the non-inverting input that receives the lesser voltage of the two non-inverting inputs is coupled to the differential amplifier 250 in accordance with the teachings of the present invention.

In contrast to the example operational amplifier with selective input 105 of FIG. 1, the example operational amplifier with selective input 205 of FIG. 2 includes a controlled current source 255 that produces a current that is proportional to the difference between the voltages coupled to the differential amplifier 250 by a value of transconductance $g_m$. More specifically, the current from controlled current source 255 in the example of FIG. 2 is the voltage $V^+$ selected by selection circuit 275 minus the voltage $V^-$ coupled to the inverting input 215, the difference multiplied by a transconductance $g_m$. The current from controlled current source 255 is the differential input voltage multiplied by the transconductance $g_m$. In other words, the current source 255 produces a current given by the expression $g_m(V^+-V^-)$ where the transconductance $g_m$ is a relatively large value, typically about ten thousand microsiemens. With a $g_m$ of ten thousand microsiemens, a change of 10 millivolts in the differential input voltage would produce a change in output current of about 100 microamperes. As such, the operational amplifier with selective input 205 depicted in FIG. 2 is known as an operational transconductance amplifier. In a practical application, the output of an operational transconductance amplifier is typically coupled to a resistive load (not shown in the example of FIG. 2) that receives current from the controlled current source 255 to produce the output voltage $V_O$.

The example operational transconductance amplifier with selective input 205 of FIG. 2 also includes elements that model non-ideal characteristics inherent in practical circuits. The same non-ideal characteristics are present in traditional operational transconductance amplifiers. An output resistance $R_{OUT}$ 260 is coupled between the controlled current source 255 and the common return 270. It is usually desirable for the output resistance $R_{OUT}$ 160 to be as high as possible because the output resistance reduces the current that may be delivered to a load coupled to the output 265. The output resistance in practical operational transconductance amplifiers is typically greater than one million ohms. Other elements that model non-ideal characteristics are the finite input resistances $R_{IN1}$ 230, $R_{IN2}$ 235, and $R_{IN3}$ 240. As in the operational voltage amplifier, input resistances are typically greater than one million ohms for inputs that use bipolar transistors, and may be greater than one billion ohms for inputs that use field-effect transistors.

Figure 3A:
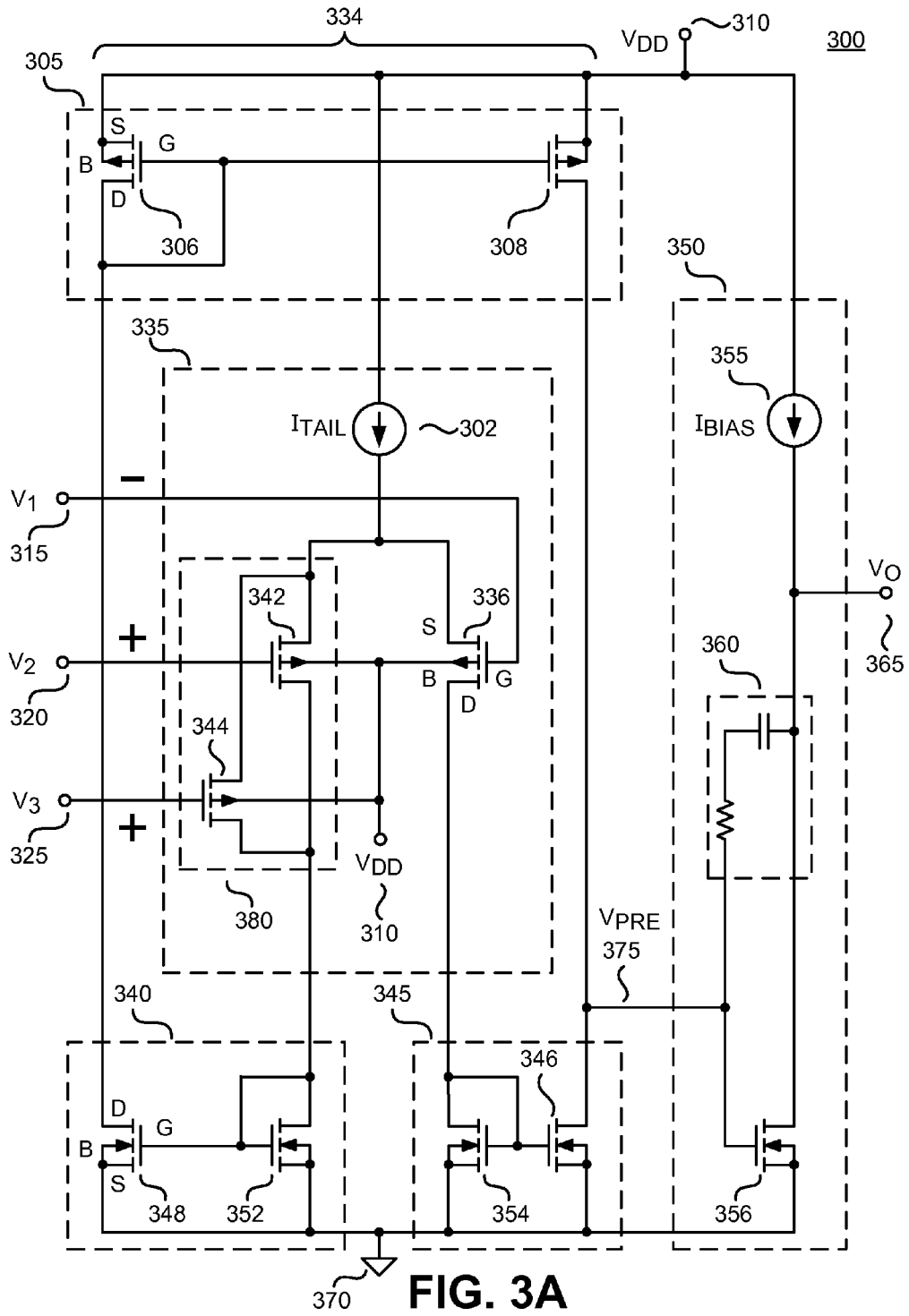
FIG. 3A is a simplified schematic diagram of an example operational transconductance amplifier with a selective input that may be fabricated with field-effect transistors in an integrated circuit in accordance with the teachings of the present invention.

The schematic diagram 300 of FIG. 3A shows an example operational transconductance amplifier with selective input that may be fabricated in an integrated circuit that uses metal-oxide semiconductor field-effect transistors (MOSFETs) in accordance with the teachings of the present invention. In the schematic diagram of FIG. 3A, transistors 306, 308, 342, 336, and 344 are p-channel (PMOS) transistors whereas transistors 348, 352, 354, 346, and 356 are n-channel (NMOS) transistors. Each transistor in the schematic diagram of FIG. 3A has a gate terminal G, a drain terminal D, a source terminal S, and a bulk terminal B. The gate terminal G may be considered a control terminal.

As shown in example schematic diagram of FIG. 3A, an example operational transconductance amplifier with selective input 300 includes a selective differential stage 334 and an output stage 350. As shown in the example, the selective differential stage 334 includes current mirrors 305, 340 and 345. In one example, the output stage 350 includes an optional compensation network 360 as shown. The example circuit of FIG. 3A receives a power supply voltage $V_{DD}$ between a power supply terminal 310 and a return terminal 370.

In the illustrated example, the selective differential stage 334 also includes a current distribution circuit 335 having a current source 302 that provides current $I_{TAIL}$ to the source terminals of PMOS transistors 342, 336, and 344, which are coupled in a differential configuration. A current that is distributed to transistors coupled in a differential configuration is sometimes called a tail current in reference to the appearance of the circuit as it is traditionally drawn. The tail current may be provided in a variety of ways known in the art. Components that provide the tail current may be referred to as tail elements. The current distribution circuit 335 includes a selection circuit 380 with PMOS transistors 342 and 344 included in one of the current paths of the current distribution circuit 335. The gates of PMOS transistors 336, 342, and 344 are coupled to input terminals 315, 320, and 325 respectively to receive respective signal voltages $V_1$, $V_2$, and $V_3$. The bulk terminals of PMOS transistors 342, 336, and 344 are coupled to the power supply voltage $V_{DD}$ at power supply terminal 310.

The current distribution circuit 335 in the example of FIG. 3A distributes the current $I_{TAIL}$ of current source 302 to current mirrors 340 and 345. NMOS transistor 354 of current mirror 345 receives a portion of current $I_{TAIL}$ from PMOS transistor 336. NMOS transistor 352 of current mirror 340 receives the remaining portion of current $I_{TAIL}$ from the selection circuit 380.

NMOS transistor 346 in current mirror 345 in the example of FIG. 3A may conduct a scaled replica of the current received by NMOS transistor 354, the scaling factor determined by the relative geometries of the two transistors 354 and 346. Typically the transistors of a current mirror are identical, so that the mirrored current in transistor 346 is substantially a duplicate of the current in transistor 354. Similarly, NMOS transistor 348 may conduct a scaled replica of the current received by NMOS transistor 352, which in one example may be substantially a duplicate of the current received by NMOS transistor 352.

Similarly, PMOS transistor 306 in current mirror 305 in the example of FIG. 3A receives the current from NMOS transistor 348. In one example, current mirror 305 mirrors the current received by PMOS transistor 306 to a substantially duplicate current in PMOS transistor 308. The currents in NMOS transistor 346 and PMOS transistor 308 produce a pre-amplified voltage $V_{PRE}$ 375 that is received by the output stage 350 to produce an output voltage $V_O$ at an output terminal 365. Output stage 350 includes a current source 355 that provides a bias current $I_{BIAS}$, an NMOS transistor 356 that receives the pre-amplified voltage $V_{PRE}$ 375 at its gate terminal, and an optional compensation network 360 coupled between the gate terminal of NMOS transistor 356 and the output terminal 365.

In the example, the output stage 350 includes an amplifier responsive to currents from the current distribution circuit 335. In one example, NMOS transistor 356 amplifies the pre-amplified voltage $V_{PRE}$ 375. The optional compensation network 360 may reduce the gain of the amplifier at high frequencies to avoid undesirable oscillation of the output voltage.

In operation, current distribution circuit 335 distributes the tail current $I_{TAIL}$ from current source 302 between two paths. One path is through PMOS transistor 336. The other path is through the selection circuit 380. The current in each path is determined by the difference between the voltage $V_1$ at inverting input 315 and the lesser of the voltages $V_2$ and $V_3$ received respectively at non-inverting inputs 320 and 325 by the selection circuit 380 in accordance with the teachings of the present invention. In other words, if the signal voltage $V_1$ at inverting input 315 is greater than either the signal voltage $V_2$ at inverting input 320 or the signal voltage $V_3$ at inverting input 325, then the current in PMOS transistor 336 will be less than the current through the selection circuit 380. If the signal voltage $V_1$ at inverting input 315 is less than the lesser of the signal voltages $V_2$ and $V_3$ at the respective non-inverting inputs 320 and 325, then the current in PMOS transistor 336 will be greater than the current through the selection circuit 380. If the voltages $V_1$, $V_2$, and $V_3$ at the respective inputs 315, 320, and 325 are identical, and if transistors 336, 342, and 334 are substantially identical, then the current $I_{TAIL}$ from current source 302 will be distributed substantially equally among PMOS transistors 336, 342, and 334.

The selection circuit 380 may divert its portion of current $I_{TAIL}$ through either of two paths in response to the signal voltages $V_2$ and $V_3$ received at non-inverting inputs 320 and 325 respectively. One path is through PMOS transistor 342. The other path is through PMOS transistor 344. If signal voltage $V_2$ at input 320 that is coupled to the gate of PMOS transistor 342 is less than signal voltage $V_3$ at input 325 that is coupled to the gate of PMOS transistor 344, then PMOS transistor 342 will conduct the current through selection circuit 380, and current distribution circuit 335 will distribute the current $I_{TAIL}$ in response to the difference between signal voltage $V_2$ and signal voltage $V_1$. If signal voltage $V_3$ at input 325 that is coupled to the gate of PMOS transistor 344 is less than signal voltage $V_2$ at input 320 that is coupled to the gate of PMOS transistor 342, then PMOS transistor 344 will conduct the current through selection circuit 380, and current distribution circuit 335 will distribute the current $I_{TAIL}$ in response to the difference between signal voltage $V_3$ and signal voltage $V_1$.

The above explanation is for the example of identical PMOS transistors 342 and 344 in the selection circuit 380. In other examples, PMOS transistors 342 and 344 in selection circuit 380 may be fabricated to have different dimensions. The relative sizes of PMOS transistors 342 and 344 in the selection circuit may be selected to give the two non-inverting inputs desired asymmetric characteristics. For example, the non-inverting input that is designated to be coupled to a clamping voltage may have a smaller transistor to achieve a softer clamping characteristic when the voltage at the other input approaches the clamping voltage.

Figure 3B:
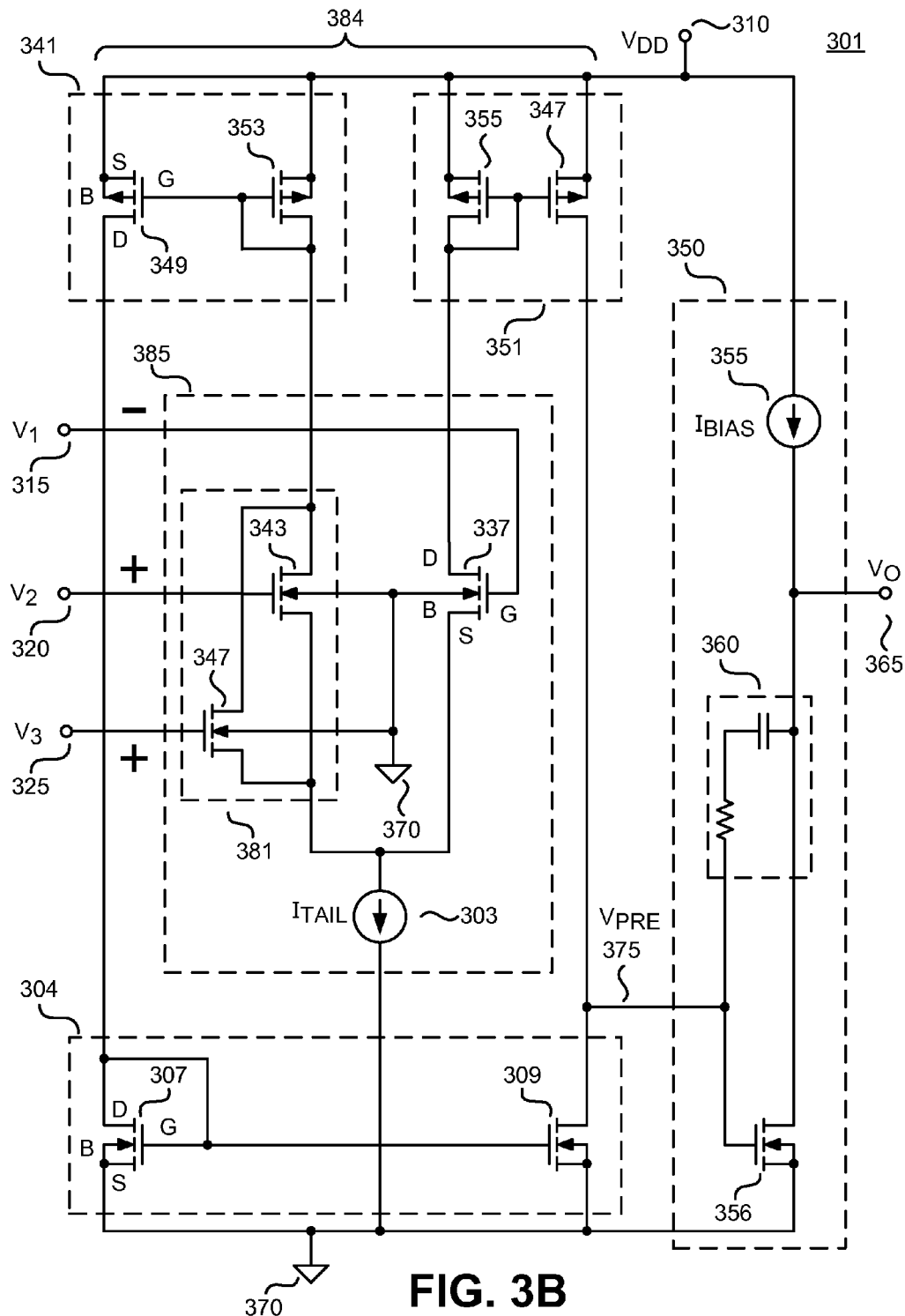
FIG. 3B is a simplified schematic diagram of another example operational transconductance amplifier with a selective input that may be fabricated with field-effect transistors in an integrated circuit in accordance with the teachings of the present invention.

In another example, the current distribution circuit 335 with selection circuit 380 of FIG. 3A may be constructed with NMOS transistors instead of PMOS transistors to provide selection of the greater of the two non-inverting inputs instead of the lesser of the two non-inverting inputs as illustrated in the example of FIG. 3B. The example construction with NMOS transistors of FIG. 3B shows a selective differential stage 384 including a current distribution circuit 385 with selection circuit 381 and a current source 303 that takes a tail current $I_{TAIL}$ from the source terminals of NMOS transistors 347, 343, and 337 to the return terminal 370. Current mirror 304 of FIG. 3B includes NMOS transistors 307 and 309 with sources coupled to the return terminal 370, analogous to current source 305 of FIG. 3A with source terminals coupled to the power supply terminal 310. Current mirror 341 of FIG. 3B with PMOS transistors 353 and 349 is analogous to current mirror 340 of FIG. 3A with NMOS transistors 352 and 348 respectively. Current mirror 351 of FIG. 3B with PMOS transistors 355 and 347 is analogous to current mirror 345 of FIG. 3A with NMOS transistors 354 and 346 respectively.

Figure 4:
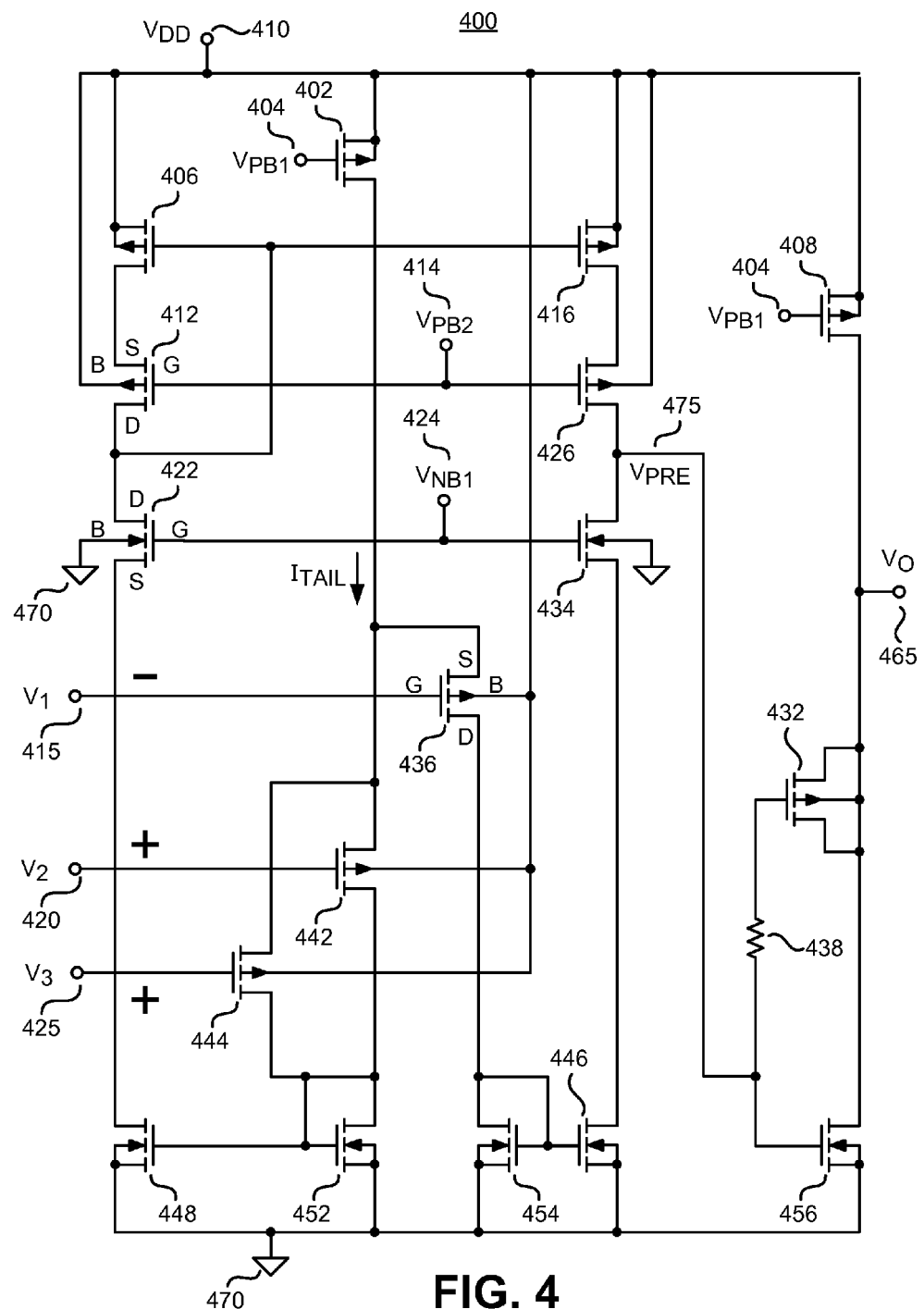
FIG. 4 is schematic diagram of an example operational transconductance amplifier with selective input that illustrates a folded cascode configuration of the amplifier in accordance with the teachings of the present invention.

The schematic diagram 400 of FIG. 4 shows another example operational transconductance amplifier with selective input 400 in the style of the example of FIG. 3A in greater detail in accordance with the teachings of the present invention. The arrangement of transistors in the example operational transconductance amplifier circuit of FIG. 4 may be referred to as a folded cascode configuration. Other configurations for operational amplifiers known in the art, such as for example the telescopic configuration, may be adapted to include a selective input in accordance with the teachings of the present invention.

The example operational transconductance amplifier with selective input 400 in FIG. 4 receives a power supply voltage $V_{DD}$ between a power supply terminal 410 and a return terminal 470. As in the example of FIG. 3A, the operational transconductance amplifier with selective input of FIG. 4 includes a selective differential stage and an output stage. The selective differential stage provides a pre-amplified output $V_{PRE}$ 475 to the output stage that includes transistors 408, 432, 456, and resistor 438.

In the example of FIG. 4, PMOS transistors 406 and 412 form the first leg of a first current mirror analogous to current mirror 305 in FIG. 3A. PMOS transistors 416 and 426 form the second leg of the first current mirror analogous to current mirror 305 in FIG. 3A. PMOS transistors 412 and 426 with their gates coupled to a bias voltage $V_{PB2}$ 414 provide a cascode buffer for respective current mirror transistors 406 and 416. NMOS transistors 452 and 448 form respectively the first leg and second leg of a second current mirror analogous to current mirror 340 in FIG. 3A. NMOS transistors 454 and 446 form respectively the first leg and second leg of a current mirror analogous to current mirror 345 in FIG. 3A. NMOS transistors 422 and 434 with their gates coupled to a bias voltage $V_{NB1}$ 424 provide a cascode buffer for respective current mirror transistors 448 and 446.

PMOS transistor 402 with its gate coupled to bias voltage $V_{PB1}$ 404 forms a tail element analogous to current source 302 of FIG. 3A to produce a tail current $I_{TAIL}$ for a current distribution circuit that includes PMOS transistors 436, 442, and 444. The current distribution circuit in the example of FIG. 4 is analogous to the current distribution circuit 335 in the example of FIG. 3A, each having two paths. PMOS transistor 436 is in the first path of the current distribution circuit. PMOS transistors 442 and 444 are in the second path of the current distribution circuit. PMOS transistors 442 and 444 in the example of FIG. 4 are included in a selection circuit analogous to the selection circuit 380 of FIG. 3A.

In the example of FIG. 4, the gate of PMOS transistor 436 is coupled to signal $V_1$ at an inverting terminal 415, the gate of PMOS transistor 442 is coupled to signal $V_2$ at a non-inverting terminal 420, and the gate of PMOS transistor 444 is coupled to signal $V_3$ at another non-inverting terminal 425. As in the example of FIG. 3A, if signal voltage $V_2$ at input 420 that is coupled to the gate of PMOS transistor 442 is less than signal voltage $V_3$ at input 425 that is coupled to the gate of PMOS transistor 444, then PMOS transistor 442 will conduct the current through the selection circuit, and the current distribution circuit will distribute the tail current from transistor 402 in response to the difference between signal voltage $V_2$ and signal voltage $V_1$. If signal voltage $V_3$ at input 425 that is coupled to the gate of PMOS transistor 444 is less than signal voltage $V_2$ at input 420 that is coupled to the gate of PMOS transistor 442, then PMOS transistor 444 will conduct the current through the selection circuit, and current distribution circuit will distribute the current $I_{TAIL}$ in response to the difference between signal voltage $V_3$ and signal voltage $V_1$.

PMOS transistor 406 in the first current mirror of FIG. 4 receives the current from NMOS transistor 448 in the second current mirror. The first current mirror mirrors the current received by PMOS transistor 406 to a substantially duplicate current in PMOS transistors 416 and 426. The current in NMOS transistors 446 and 434 with the current in PMOS transistors 416 and 426 produces a pre-amplified voltage $V_{PRE}$ 475 that is received at the gate of NMOS transistor 456 to produce an amplified output voltage $V_O$ at an output terminal 465.

PMOS transistor 408 with gate coupled to the bias voltage $V_{PB1}$ 404 forms a current source that provides a bias current to the output terminal 465. Resistor 438 and PMOS transistor 432 form an optional compensation network coupled between the output terminal 465 and the gate of PMOS transistor 456. The gate of PMOS transistor 432 is one terminal of a capacitor in the compensation network, whereas the drain, source, and bulk terminals of PMOS transistor 432 are coupled together to form the other terminal of the capacitor in the compensation network.

Figure 5:
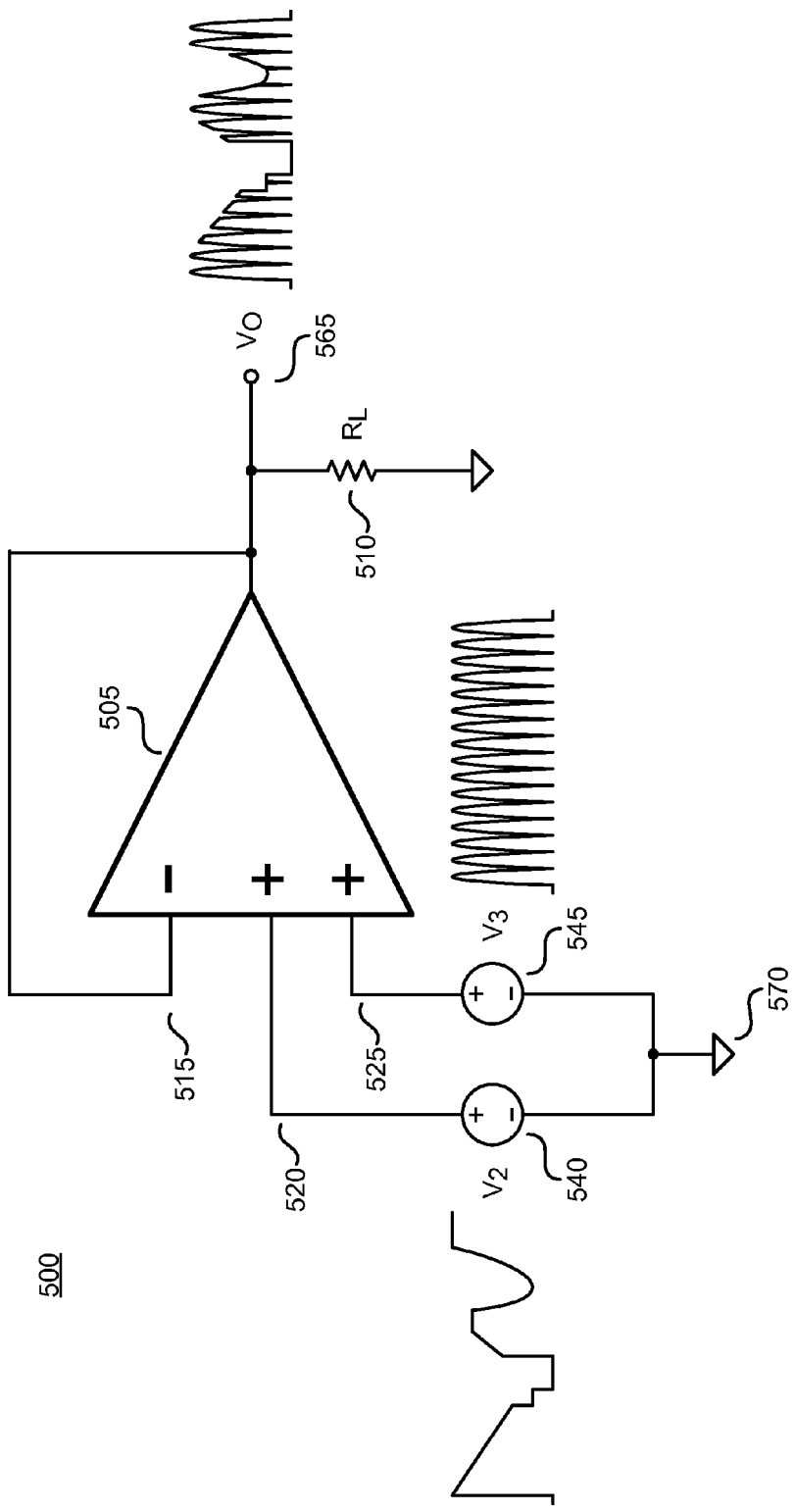
FIG. 5 is schematic diagram that shows an example voltage follower circuit that uses the example operational transconductance amplifier of FIG. 4 in accordance with the teachings of the present invention.

The schematic diagram 500 of FIG. 5 shows an example of how the operational transconductance amplifier of FIG. 4 may be used in a voltage follower application that limits the output voltage to be the lesser of two input voltages in accordance with the teachings of the present invention. The example voltage follower circuit of FIG. 5 couples the inverting input 515 to the output 565. Signal voltages $V_2$ 540 and $V_3$ 545 are coupled respectively to non-inverting inputs 520 and 525 with respect to a common return 570 to produce an output voltage $V_O$ at a load $R_L$ 510 coupled to the output 565. The output voltage $V_O$ is the lesser of the input voltages $V_2$ and $V_3$. In other words, the output is limited to the lesser of the input voltages $V_2$ and $V_3$.

Figure 6:
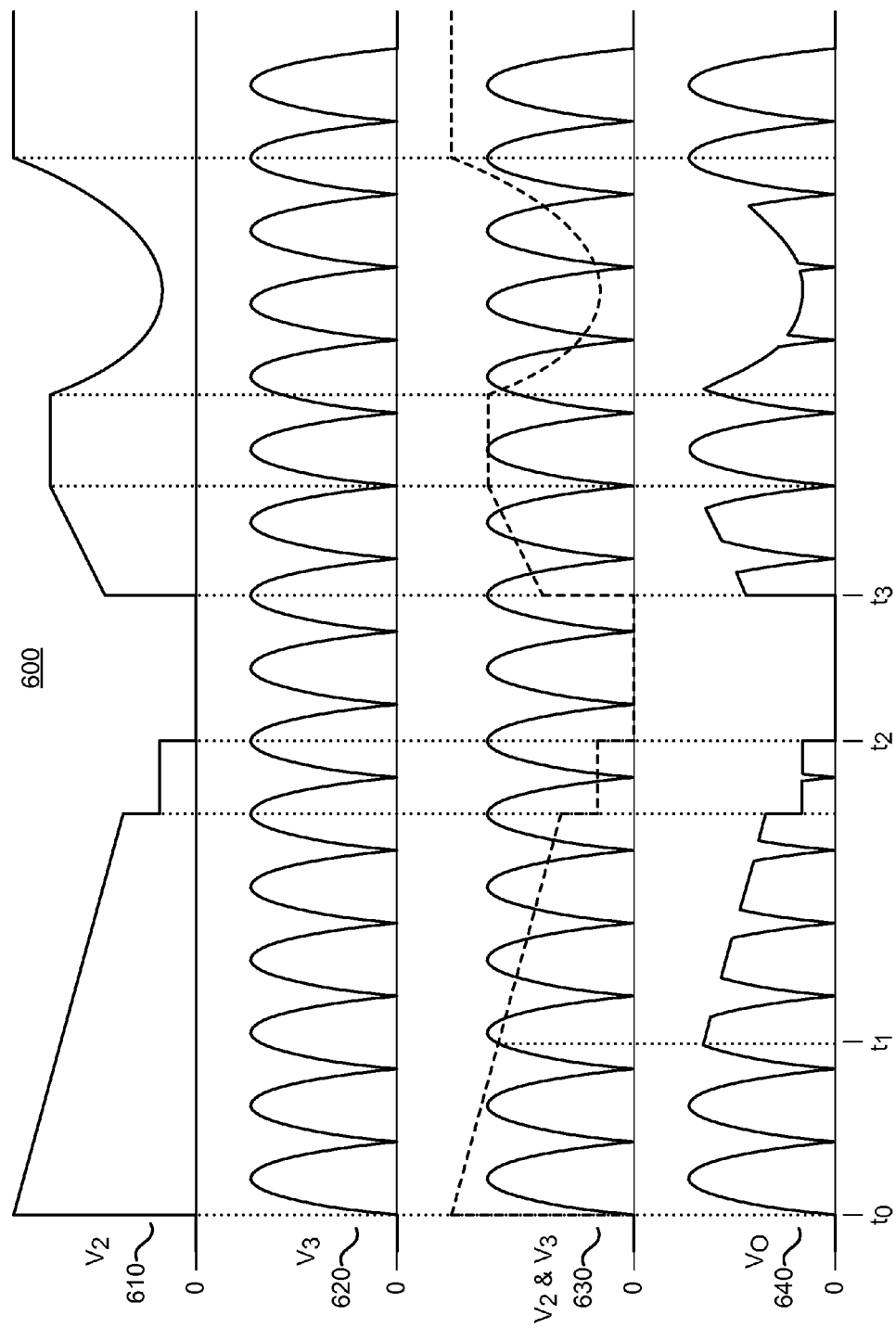
FIG. 6 is a timing diagram with example waveforms that illustrate the operation of the example voltage follower circuit of FIG. 5 in accordance with the teachings of the present invention.

The timing diagram 600 of FIG. 6 shows waveforms that illustrate the operation of the example voltage follower circuit of FIG. 5. The waveforms of FIG. 6 represent the voltages at the inputs and the outputs of the voltage follower circuit of FIG. 5 with respect to the common return 570. All waveforms are voltages plotted on the same vertical scale with time on the horizontal axis. Waveform 610 shows the signal voltage $V_2$ 540 at non-inverting input 520, waveform 620 shows signal voltage $V_3$ 545 at non-inverting input 525, and waveform 640 shows signal voltage $V_O$ at the output 565 of the voltage follower circuit of FIG. 5.

Input voltages $V_2$ and $V_3$ are superimposed in the graph 630 of FIG. 6 ($V_2$ with a broken line and $V_3$ with a solid line) to illustrate how the output voltage $V_O$ follows the lesser of the two input voltages. For example, between time $t_0$ and time $t_1$, input voltage $V_2$ is greater than $V_3$, so the waveform 640 of output voltage $V_O$ 640 is the same as waveform 620 of the input $V_3$. Between times $t_2$ and $t_3$, the waveform of output voltage $V_O$ 640 the same as waveform 610 of the input $V_2$ because the input $V_3$ is not less than $V_2$ between times $t_2$ and $t_3$. In other words, the timing diagram of FIG. 6 illustrates that the output of the voltage follower circuit of FIG. 5 may not be greater than the lesser input voltage. The example voltage follower circuit of FIG. 5 may operate as an ordinary voltage follower circuit with a single input when one input is coupled to the power supply voltage $V_{DD}$, not shown in FIG. 5

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

What is claimed is:

1. An operational amplifier, comprising:
    a selective differential stage including:
        a first current mirror having first and second legs;
        a current distribution circuit including first and second paths, wherein the first and second legs of the first current mirror are coupled to be responsive to current in the first and second paths of the current distribution circuit, wherein the first and second paths of the current distribution circuit are coupled to distribute a tail current in response to a first signal coupled to be received by a first input of the operational amplifier; and
        a selection circuit included in the second path of the current distribution circuit, wherein the selection circuit includes first and second paths, wherein current in the first path of the selection circuit is coupled to be responsive to a second signal coupled to be received by a second input of the operational amplifier, and wherein current in the second path of the selection circuit is coupled to be responsive to a third signal coupled to be received by a third input of the operational amplifier; and
    an output stage coupled to generate an output signal responsive to the selective differential stage, wherein the output signal is responsive to a difference between the first signal and one of the second and third signals.

2. The operational amplifier of claim 1 wherein the first path of the current distribution circuit includes a first transistor coupled to be responsive to the first signal, wherein the first path of the selection circuit includes a second transistor coupled to be responsive to the second signal, and wherein the second path of the selection circuit includes a third transistor coupled to be responsive to the third signal.

3. The operational amplifier of claim 2 wherein the first, second, and third transistors comprise p-channel transistors having control terminals coupled to receive the first, second, and third signals, respectively, wherein current in the second path of the current distribution circuit is responsive to a lesser of the second and third signals.

4. The operational amplifier of claim 1 wherein the selective differential stage further includes a second current mirror having first and second legs, wherein the first leg of the second current mirror is coupled to the second path of the current distribution circuit and wherein the second leg of the second current mirror is coupled to the first leg of the first current mirror.

5. The operational amplifier of claim 1 wherein the selective differential stage further includes a third current mirror having first and second legs, wherein the first leg of the third current mirror is coupled to the first path of the current distribution circuit, and wherein the second leg of the third current mirror is coupled to the second leg of the first current mirror.

6. The operational amplifier of claim 1 wherein the selective differential stage further includes a tail element coupled to the first and second paths of the current distribution circuit, wherein the first and second paths of the selection circuit included in the first path of the current distribution circuit are further coupled to the tail element.

7. The operational amplifier of claim 6 wherein the tail element comprises a current source coupled to provide a tail current distributed between the first and second paths of the current distribution circuit.

8. The operational amplifier of claim 1 wherein the output stage comprises an amplifier circuit coupled to the second leg of the first current mirror to be responsive to the selective differential stage.

9. The operational amplifier of claim 8 wherein the output stage further comprises a compensation network coupled to an output of the output stage.

10. The operational amplifier of claim 8 wherein the output stage further comprises a bias current source coupled to an output of the output stage.

11. The operational amplifier of claim 1 wherein the first input of the operational amplifier is an inverting input of the operational amplifier, and wherein the second and third inputs of the operational amplifier are non-inverting inputs of the operational amplifier.

12. A voltage follower circuit, comprising:
an operational amplifier having first, second and third inputs, and an output, wherein the output of the operational amplifier is coupled to the first input of the operational amplifier, wherein the second input of the operational amplifier is coupled to receive a limiting signal, wherein the third input of the operational amplifier is coupled to receive an input signal, wherein the operational amplifier includes:
a selective differential stage including:
a first current mirror having first and second legs;
a current distribution circuit including first and second paths, wherein the first and second legs of the first current mirror are coupled to be responsive to current in the first and second paths of the current distribution circuit, wherein the first and second paths of the current distribution circuit are coupled to distribute a tail current in response to the first input of the operational amplifier; and
a selection circuit included in the second path of the current distribution circuit, wherein the selection circuit includes first and second paths, wherein current in the first path of the selection circuit is coupled to be responsive to the second input of the operational amplifier, and wherein current in the second path of the selection circuit is coupled to be responsive to the third input of the operational amplifier; and
an output stage coupled to generate an output signal of the operational amplifier responsive to the selective differential stage, wherein the output signal is responsive to a difference between the first signal and a lesser of the second and third signals; and
an output load coupled to the output of the operational amplifier.

13. The voltage follower circuit of claim 12 wherein the operational amplifier comprises an operational transconductance amplifier.

14. The voltage follower circuit of claim 13 wherein the output load comprises a resistance coupled between the output of the operational amplifier and a ground terminal.

15. The voltage follower circuit of claim 12 wherein the first path of the current distribution circuit includes a first p-channel transistor coupled to be responsive to the output of the operational amplifier, wherein the first path of the selection circuit includes a second p-channel transistor coupled to be responsive to the limiting signal, and wherein the second path of the selection circuit includes a third p-channel transistor coupled to be responsive to the input signal.

16. The voltage follower circuit of claim 12 wherein the first current mirror of the operational amplifier comprises a first current mirror having the first and second legs.

17. The voltage follower circuit of claim 16 wherein the selective differential stage further includes a second current mirror having first and second legs, wherein the first leg of the second current mirror is coupled to the second path of the current distribution circuit, and wherein the second leg of the second current mirror is coupled to the first leg of the first current mirror.

18. The voltage follower circuit of claim 16 wherein the wherein the selective differential stage further includes a third current mirror having first and second legs, wherein the first leg of the third current mirror is coupled to the first path of the current distribution circuit, wherein the second leg of the third current mirror is coupled to the second leg of the first current mirror.

19. The voltage follower circuit of claim 12 wherein the selective differential stage of the operational amplifier further includes a tail element coupled to the first and second paths of the current distribution circuit, wherein the first and second paths of the selection circuit included in the first path of the current distribution circuit are further coupled to the tail element.

20. The voltage follower circuit of claim 19 wherein the tail element of the selective differential stage of the operational amplifier comprises a current source coupled to provide a tail current distributed between the first and second paths of the distribution circuit.

21. The voltage follower circuit of claim 12 wherein the output stage of the operational amplifier comprises an amplifier circuit coupled to the second leg of the first current mirror to be responsive to the selective differential stage.

22. The voltage follower circuit of claim 12 wherein the first input of the operational amplifier is an inverting input of the operational amplifier, and wherein the second and third inputs of the operational amplifier are non-inverting inputs of the operational amplifier.

* * * * *